(12) United States Patent
Kim et al.

(10) Patent No.: US 9,799,701 B2
(45) Date of Patent: Oct. 24, 2017

(54) IMAGE SENSOR AND METHOD FOR MANUFACTURING SAME

(71) Applicants: Rayence Co., Ltd., Gyeonggi-do (KR); Vatech Ewoo Holdings Co., Ltd., Gyeonggi-do (KR)

(72) Inventors: Tae Woo Kim, Gyeonggi-do (KR); Dong Jin Lee, Gyeonggi-do (KR)

(73) Assignees: Rayence Co., Ltd., Gyeonggi-do (KR); VATECH EWOO Holdings Co., Ltd., Gyeonggi-do (KR)

( * ) Notice: Subject to any disclaimer, the term of this patent is extended or adjusted under 35 U.S.C. 154(b) by 27 days.

(21) Appl. No.: 14/903,722

(22) PCT Filed: Jul. 8, 2014

(86) PCT No.: PCT/KR2014/006128
§ 371 (c)(1),
(2) Date: Jan. 8, 2016

(87) PCT Pub. No.: WO2015/005659
PCT Pub. Date: Jan. 15, 2015

(65) Prior Publication Data
US 2016/0155770 A1  Jun. 2, 2016

(30) Foreign Application Priority Data
Jul. 8, 2013 (KR) .................. 10-2013-0079621

(51) Int. Cl.
*H01L 27/146* (2006.01)

(52) U.S. Cl.
CPC .. *H01L 27/14676* (2013.01); *H01L 27/14683* (2013.01)

(58) Field of Classification Search
CPC ................................. H01L 27/14676
See application file for complete search history.

(56) References Cited

U.S. PATENT DOCUMENTS

| 7,564,050 | B2* | 7/2009 | Irisawa | ......... | G01T 1/246 |
| | | | | | 250/370.09 |
| 7,728,299 | B2* | 6/2010 | Irisawa | ......... | G01T 1/246 |
| | | | | | 250/208.1 |
| 8,138,567 | B2* | 3/2012 | Ivanov | ......... | H01L 31/0296 |
| | | | | | 257/436 |
| 8,916,947 | B2* | 12/2014 | Sargent | ......... | H01L 27/1461 |
| | | | | | 257/184 |

(Continued)

FOREIGN PATENT DOCUMENTS

| JP | 2005-260081 A | 9/2005 |
| JP | 4364553 B2 | 11/2009 |

(Continued)

*Primary Examiner* — Eugene Lee
(74) *Attorney, Agent, or Firm* — IP Legal Services, LLC

(57) ABSTRACT

Disclosed is an image sensor, which is characterized by increased strength of adhesion between a photoconductive layer and a substrate, and which includes a protective film formed on the surface of a substrate having a pad electrode, a buffer layer formed on the protective film and composed of a precious metal material or an oxide material, a photoconductive layer formed on the buffer layer, and an upper electrode formed on the photoconductive layer.

10 Claims, 5 Drawing Sheets

(56) References Cited

U.S. PATENT DOCUMENTS

| | | | |
|---|---|---|---|
| 2001/0010361 A1* | 8/2001 | Izumi | H01L 27/14665 250/370.08 |
| 2001/0020683 A1 | 9/2001 | Teranuma et al. | |
| 2005/0161754 A1 | 7/2005 | Izumi | |
| 2008/0230710 A1* | 9/2008 | Noda | C23C 14/14 250/370.12 |
| 2008/0303022 A1 | 12/2008 | Tai et al. | |
| 2009/0152664 A1* | 6/2009 | Klem | H01L 27/14603 257/440 |
| 2010/0127279 A1* | 5/2010 | Takahashi | H01L 27/14676 257/80 |
| 2010/0176401 A1* | 7/2010 | Lee | H01L 27/14603 257/59 |
| 2010/0320391 A1* | 12/2010 | Antonuk | H01L 27/1462 250/366 |
| 2011/0244614 A1* | 10/2011 | Adachi | H01L 27/1266 438/34 |
| 2014/0240631 A1* | 8/2014 | Shishido | G02F 1/136286 349/43 |

FOREIGN PATENT DOCUMENTS

| | | |
|---|---|---|
| KR | 10-2001-0089211 A | 9/2001 |
| KR | 10-2008-0108897 A | 12/2008 |

\* cited by examiner

IMAGE SENSOR AND METHOD FOR MANUFACTURING SAME

CROSS REFERENCE TO RELATED APPLICATIONS

This application is a National Stage Patent Application of PCT International Patent Application No. PCT/KR2014/006128 (filed on Jul. 8, 2014) under 35 U.S.C. §371, which claims priority to Korean Patent Application No. 10-2013-0079621 (filed on Jul. 8, 2013), the teachings of which are incorporated herein in their entireties by reference.

TECHNICAL FIELD

The present invention relates to an image sensor and, more particularly, to an image sensor in which the strength of adhesion between a photoconductive layer and a substrate is enhanced, and a method of manufacturing the same.

BACKGROUND ART

Conventionally, X-rays for medical or industrial applications have been typically taken using films and screens. In this case, the use of resources and time becomes inefficient due to problems related to the development and storage of the taken films.

Hence, digital-type image sensors are currently widely used. Such image sensors are classified into indirect conversion-type image sensors and direct conversion-type image sensors.

Indirect conversion-type image sensors function such that X-rays are converted into visible light using a scintillator, after which the visible light is converted into an electrical signal. By comparison, direct conversion-type image sensors function such that X-rays are directly converted into an electrical signal using a photoconductive layer. Direct conversion-type image sensors are suitable for use in high-resolution systems because there is no need for an additional scintillator and the spreading of light does not occur.

The photoconductive layer used in the direct conversion-type image sensor is formed through deposition on the surface of a CMOS substrate. However, the photoconductive layer adheres poorly to the protective film on the surface of the CMOS substrate, undesirably incurring defects in which the photoconductive layer comes loose from the surface of the substrate.

DISCLOSURE

Technical Problem

Accordingly, an object of the present invention is to provide a way to increase the strength of adhesion between a photoconductive layer and a substrate.

Technical Solution

In order to accomplish the above object, an aspect of the present invention provides an image sensor, comprising: a protective film formed on the surface of a substrate having a pad electrode; a buffer layer formed on the protective film and comprising a precious metal material or an oxide material; a photoconductive layer formed on the buffer layer; and an upper electrode formed on the photoconductive layer.

The protective film may include a pad hole for exposing the pad electrode, and the buffer layer may be formed around the pad electrode and may be electrically disconnected from the pad electrode. The precious metal material for the buffer layer may comprise at least one selected from among Ag, Au, Pt, and Pd. The oxide material for the buffer layer may comprise at least one selected from among $Al_2O_3$, $TiO_2$, and $ZrO_2$. The area of the buffer layer in a pixel region is 10 to 90% of an area of the pixel region. The photoconductive layer may comprise at least one selected from among CdTe, CdZnTe, PbO, $PbI_2$, $HgI_2$, GaAs, Se, TlBr, and $BiI_3$. The buffer layer may have a voltage applied thereto, or may be in a floating state. The substrate may be a CMOS substrate, a glass substrate, a graphite substrate, or a substrate configured such that ITO is formed on an aluminum oxide base. The image sensor may further comprise an intermediate layer formed of Cr between the protective film and the buffer layer.

Another aspect of the present invention provides a method of manufacturing an image sensor, comprising: forming a protective film on the surface of a substrate having a pad electrode; forming a buffer layer comprising a precious metal material or an oxide material on the protective film; forming a photoconductive layer on the buffer layer; and forming an upper electrode on the photoconductive layer.

ADVANTAGEOUS EFFECTS

According to the present invention, an image sensor is configured such that a buffer layer having increased strength of adhesion to a substrate and a photoconductive layer is provided between the substrate and the photoconductive layer. Thereby, the strength of adhesion of the photoconductive layer to the substrate can be effectively enhanced. Furthermore, the buffer layer enables the concentration of an electric field, thus reducing leakage current.

MODE FOR INVENTION

Hereinafter, a detailed description will be given of embodiments of the present invention, with reference to the appended drawings.

Figure 1:
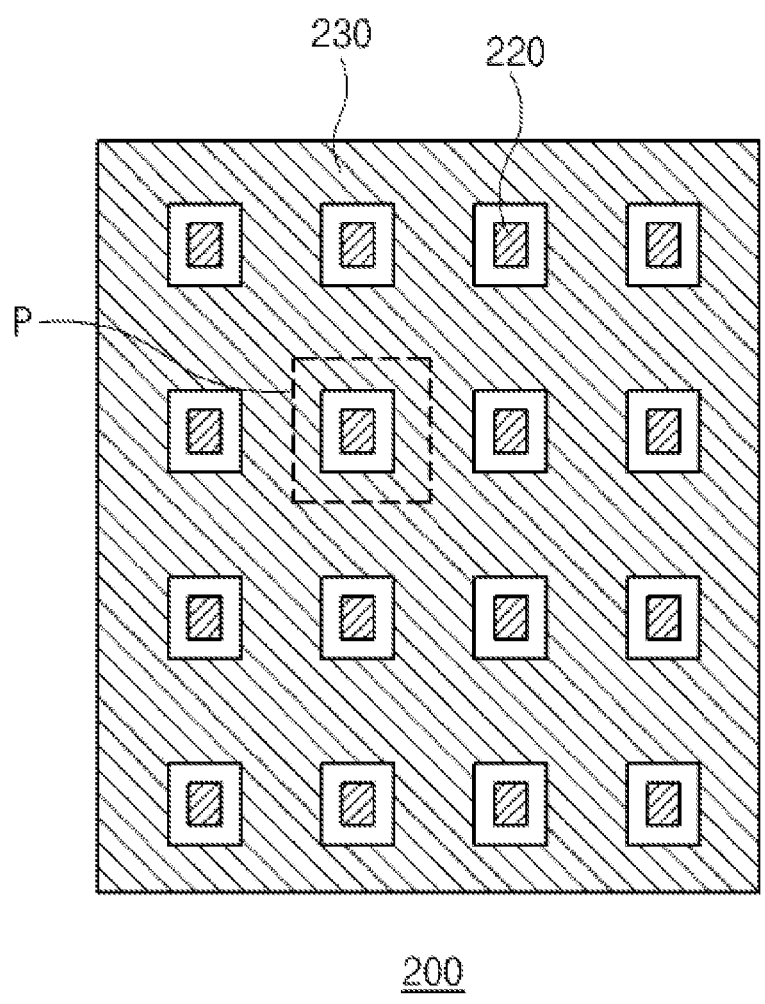
FIGS. 1 and 2 are, respectively, a top plan view and a cross-sectional view schematically illustrating an image sensor according to an embodiment of the present invention.
Figure 2:
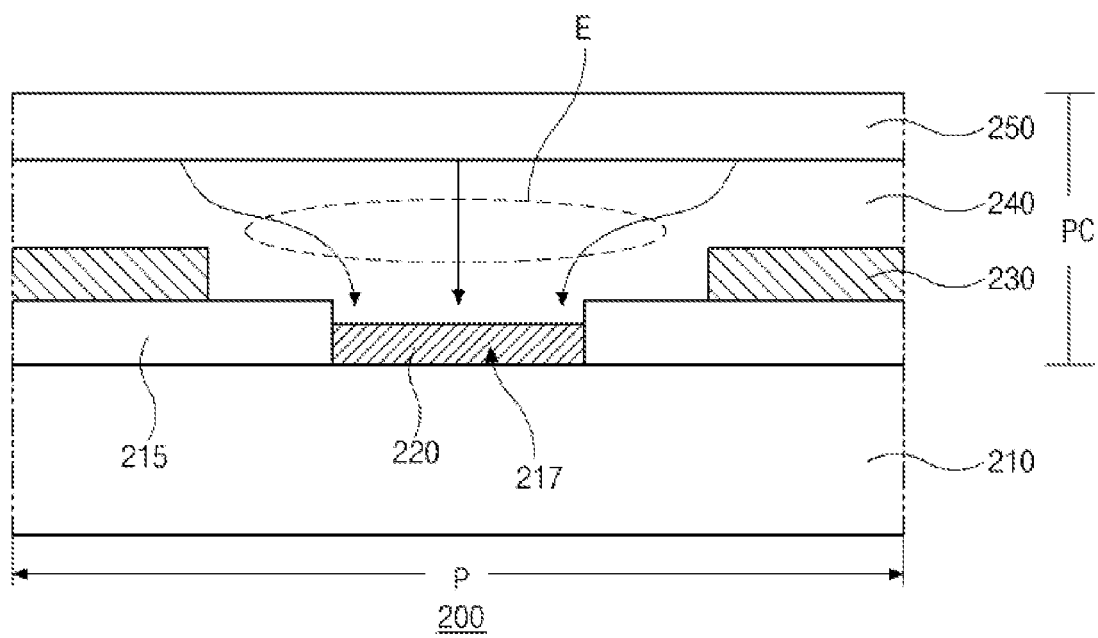

FIGS. 1 and 2 are, respectively, a top plan view and a cross-sectional view schematically illustrating an image sensor according to an embodiment of the present invention.

According to an embodiment of the present invention, an image sensor 200 may be employed in a variety of X-ray imaging devices having various shapes or end uses. Examples of such X-ray imaging devices may include mammographic devices, CT devices, etc.

The image sensor 200 is configured such that X-rays that pass through an objective are detected and then converted into an electrical signal. The image sensor 200 has a rectangular shape when viewed from above, but the present invention is not limited thereto.

In particular, the image sensor 200 according to the embodiment of the present invention is a direct conversion-type X-ray detector, whereby the incident X-rays are directly converted into an electrical signal.

With reference to FIGS. 1 and 2, the image sensor 200 may include a plurality of pixel regions P, which are disposed in the form of a matrix having rows and columns.

Each of the plurality of pixel regions P may be configured such that a photoelectric converter (PC) for converting X-rays into an electrical signal is formed on a substrate 210.

Examples of the substrate 210 for use in the image sensor 200 may include, but are not limited to, a CMOS substrate, a glass substrate, a graphite substrate, and a substrate configured such that ITO is formed on an aluminum oxide ($Al_2O_3$) base. For the sake of description, a CMOS substrate is used in the embodiment of the present invention.

A protective film 215 is formed on the surface of the substrate 210. The protective film 215 may be formed of an inorganic insulating material, for example, silicon oxide ($SiO_2$) or silicon nitride ($SiN_x$).

The protective film 215 may include a pad hole 217 formed for each pixel region P. A pad electrode 220 may be provided in the pad hole 217. The pad electrode 220 is an electrode that is provided in the photoelectric converter (PC), and corresponds to, for example, a first electrode 220.

A buffer layer 230 is formed on the substrate 210 having the pad electrode 220. The buffer layer 230 may be formed of a material having high strength of adhesion to the protective film 215. In this regard, for example, the buffer layer 230 is preferably composed of a metal material having conductivity, especially at least one selected from among precious metals, including silver (Ag), gold (Au), platinum (Pt), and palladium (Pd).

Alternatively, the buffer layer 230 may be composed of an oxide film, and preferably at least one selected from among oxide materials, including $Al_2O_3$, $TiO_2$, and $ZrO_2$.

In this way, when the buffer layer 230 is provided between the protective film 215 and the photoconductive layer 240, which is formed in subsequent processing, the strength of adhesion of the photoconductive layer 240 to the substrate 210 may be increased.

The photoconductive layer 240 has particularly poor strength of adhesion to a protective film 215 made of silicon nitride. In this case, the effect by the buffer layer 230 of increasing the strength of adhesion is even stronger.

When the buffer layer 230 is made of a precious metal, the corresponding buffer layer 230 is preferably spaced apart from the pad electrode 220, and is thus electrically disconnected from the pad electrode. For each pixel region P, when viewed from above, the buffer layer 230 may be formed on at least a portion of the periphery of the pad electrode 220 so as to be spaced apart from the edge of the pad electrode 220.

On the other hand, when the buffer layer 230 is formed of an oxide film, the corresponding buffer layer 230 has insulating properties, and thus there is no need to consider the electrical disconnection from the pad electrode 220. Therefore, unlike the buffer layer 230 made of a metal material, the buffer layer 230 made of an oxide film may be formed so as to expose at least a portion thereof by overlapping the pad electrode 220. For example, the buffer layer 230 may have an opening that substantially matches the pad hole 217.

The buffer layer 230 may have an area of about 10 to 90% relative to the area of the pixel region P.

With regard to the formation of the buffer layer 230, as illustrated in FIG. 1, the buffer layer may be formed around the pad electrode 220.

Figure 3:
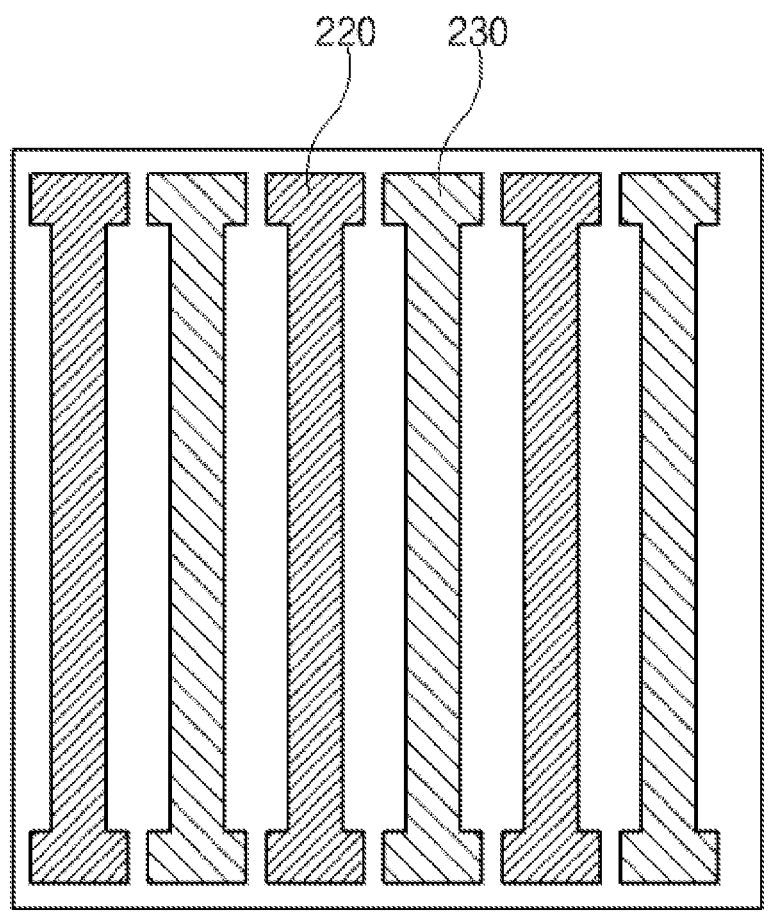
FIGS. 3 to 5 are top plan views schematically illustrating the formation of the buffer layer according to embodiments of the present invention.
Figure 4:
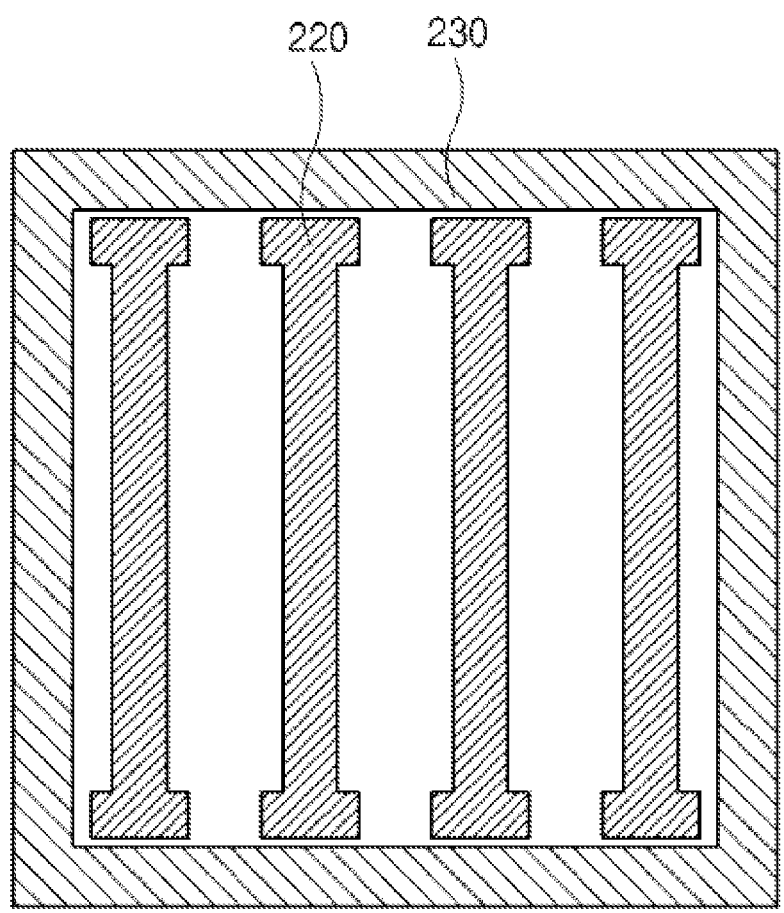
Figure 5:
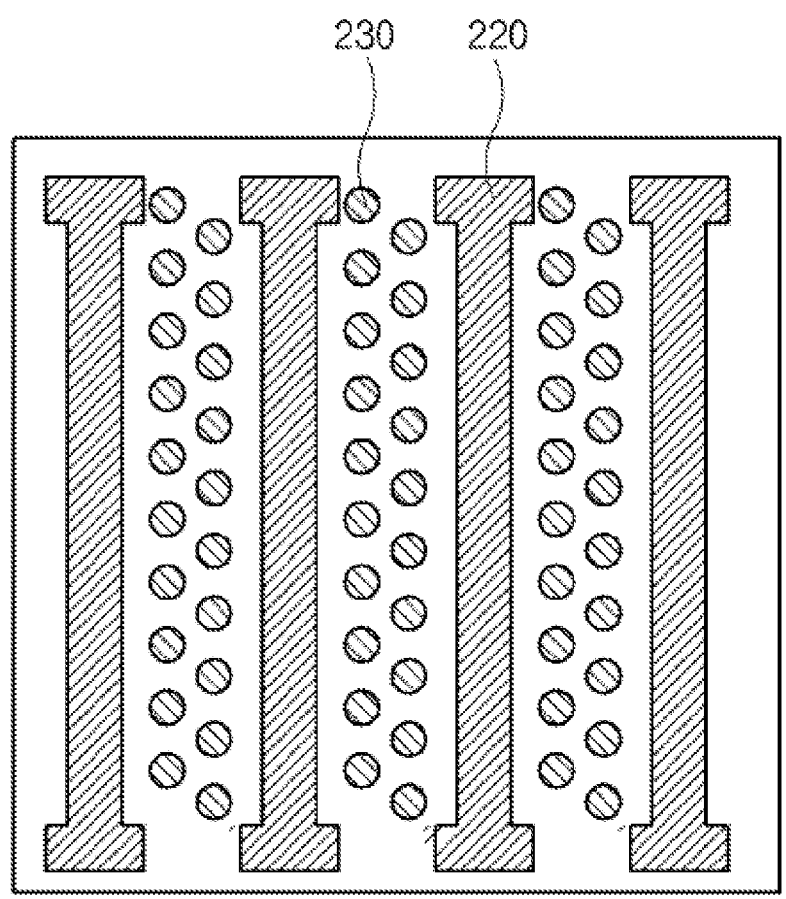

In the other embodiments, the buffer layer 230 may be formed as illustrated in FIGS. 3 to 5. Specifically, as shown in FIG. 3, the buffer layer 230 may be formed between pad electrodes 220. As shown in FIG. 4, the buffer layer 230 may be formed so as to enclose a plurality of pad electrodes 220. As shown in FIG. 5, the buffer layer 230 may be provided in the form of a dot pattern between pad electrodes 220.

The buffer layer 230 may be formed variously as described above, and may also be provided in other forms.

On the substrate 210 having the buffer layer 230, a photoconductive layer 240 may be formed for each pixel region P.

When X-rays are incident on the photoconductive layer 240, electron-hole pairs are generated. The photoconductive layer 240 may be made of a material having superior charge mobility, a high absorption coefficient, low dark current, or low electron-hole pair generation energy. For example, at least one selected from among photoconductive materials, such as CdTe, CdZnTe, PbO, $PbI_2$, $HgI_2$, GaAs, Se, TlBr, and $BiI_3$, may be used.

An upper electrode 250 may be formed on the substrate 210 having the photoconductive layer 240. A bias voltage may be applied to the upper electrode 250. The upper electrode 250 is the other electrode that is provided in the photoelectric converter (PC), and corresponds to, for example, a second electrode 250. The upper electrode 250 may be formed over the entire surface of the substrate 210.

For the image sensor 200 thus configured, the buffer layer 230 plays a role in increasing the strength of adhesion of the photoconductive layer 240 to the substrate. When the buffer layer 230 is made of a metal material, the concentration of an electric field is possible, and thus leakage current may be reduced.

In this regard, the buffer layer 230 is formed around the first electrode 220, whereby the electric field E, generated between the second electrode 250 and the first electrode 220, may be guided inwards by means of the buffer layer 230. In this way, the buffer layer 230 may function as a guard ring in the formation of the electric field E.

To this end, the buffer layer 230 may have a voltage applied thereto, or may be in a floating state.

Although not shown, in order to increase the strength of adhesion between the buffer layer 230 and the protective film 215, an intermediate layer made of a metal material such as Cr may be further provided.

As described hereinbefore, according to embodiments of the present invention, a buffer layer having superior strength of adhesion to the substrate and the photoconductive layer is provided between the substrate and the photoconductive layer. Thereby, the strength of adhesion between the photoconductive layer and the substrate may be effectively increased. Furthermore, when the buffer layer is made of a metal material, the concentration of an electric field is possible by means of the buffer layer, thus reducing leakage current.

The invention claimed is:

1. An image sensor, comprising:
  a protective film pattern formed on a surface of a substrate;
  a pad electrode surrounded by the protective film pattern;
  a buffer layer formed on the protective film pattern to expose the pad electrode and comprising a precious metal material or an oxide material;
  a photoconductive layer formed directly on the buffer layer and the pad electrode; and
  an upper electrode formed on the photoconductive layer.

2. The image sensor of claim 1, wherein the protective film pattern includes a pad hole for exposing the pad electrode, and the buffer layer exposes the pad electrode and is electrically disconnected from the pad electrode.

3. The image sensor of claim 1, wherein the precious metal material for the buffer layer comprises at least one selected from among Ag, Au, Pt, and Pd.

4. The image sensor of claim 1, wherein the oxide material for the buffer layer comprises at least one selected from among $Al_2O_3$, $TiO_2$, and $ZrO_2$.

5. The image sensor of claim 1, further comprising a pixel region disposed in a matrix form including a part of the buffer layer, wherein an area of the buffer layer in the pixel region is 10 to 90% of an area of the pixel region.

6. The image sensor of claim 1, wherein the photoconductive layer comprises at least one selected from among CdTe, CdZnTe, PbO, $PbI_2$, $HgI_2$, GaAs, Se, TlBr, and $BiI_3$.

7. The image sensor of claim 1, wherein the buffer layer comprising the precious metal material has a voltage applied thereto, or is in a floating state.

8. The image sensor of claim 1, wherein the substrate is a CMOS substrate, a glass substrate, a graphite substrate, or an aluminum oxide based ITO substrate.

9. The image sensor of claim 1, further comprising an intermediate layer formed of Cr between the protective film pattern and the buffer layer.

10. A method of manufacturing an image sensor, comprising:

forming a protective film pattern on a surface of a substrate;

forming a pad electrode surrounded by the protective film pattern;

forming a buffer layer on the protective film pattern to expose the pad electrode and comprising a precious metal material or an oxide material on the protective film pattern;

forming a photoconductive layer directly on the buffer layer and on the pad electrode; and forming an upper electrode on the photoconductive layer.

* * * * *